US008180939B2

(12) United States Patent  
Kim et al.

(10) Patent No.: US 8,180,939 B2
(45) Date of Patent: May 15, 2012

(54) MEMORY DEVICES IMPLEMENTING CLOCK MIRRORING SCHEME AND RELATED MEMORY SYSTEMS AND CLOCK MIRRORING METHODS

(75) Inventors: Jin-gook Kim, Suwon-si (KR); Kwang-il Park, Yongin-si (KR); Seung-jun Bae, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/013,157

(22) Filed: Jan. 25, 2011

(65) Prior Publication Data

US 2011/0185219 A1 Jul. 28, 2011

Related U.S. Application Data

(63) Continuation of application No. 12/902,328, filed on Oct. 12, 2010, now Pat. No. 8,151,010, which is a continuation of application No. 12/045,289, filed on Mar. 10, 2008, now Pat. No. 7,814,239.

(30) Foreign Application Priority Data

Mar. 13, 2007 (KR) .................. 10-2007-0024680

(51) Int. Cl.
*G06F 13/12* (2006.01)
(52) U.S. Cl. ............... 710/74; 710/62; 711/5; 711/170; 711/171; 365/189.011; 365/233.1
(58) Field of Classification Search .......... None
See application file for complete search history.

(56) References Cited

U.S. PATENT DOCUMENTS

| 5,420,824 A | * | 5/1995 | Kajimoto et al. ....... 365/230.01 |
| 5,502,621 A | | 3/1996 | Schumacher et al. |
| 5,764,590 A | | 6/1998 | Iwamoto et al. |
| 6,681,301 B1 | | 1/2004 | Mehta et al. |
| 6,818,983 B2 | | 11/2004 | Shiomi |
| 7,313,715 B2 | | 12/2007 | Yoo et al. |
| 2005/0097249 A1 | | 5/2005 | Oberlin et al. |
| 2006/0044927 A1 | | 3/2006 | Han et al. |
| 2007/0237019 A1 | | 10/2007 | Kwon |
| 2007/0291575 A1 | | 12/2007 | Lee et al. |

FOREIGN PATENT DOCUMENTS

| JP | 2003-51545 A | 2/2003 |
| KR | 10-0355240 B1 | 9/2002 |
| KR | 10-0442870 B1 | 7/2004 |
| KR | 2005-099158 A | 10/2005 |

OTHER PUBLICATIONS

"Method for Programming MRS Registers in DDR3 SO-DIMMs to Enable CA Bus Mirroring", IP.com, Sep. 13, 2005, pp. 1-4.
"Method for Minimizing the Bus Routing Length on a Dual-Sided Circuit Board", IP.com, Feb. 4, 2004, pp. 1-3.

* cited by examiner

*Primary Examiner* — Eron J Sorrell
(74) *Attorney, Agent, or Firm* — Myers Bigel Sibley & Sajovec, P.A.

(57) ABSTRACT

A memory device is configured to operate in first and second data input/output modes. The memory device includes a first electrode pad, a second electrode pad, a clock signal line, a first switching unit, and a second switching unit. The clock signal line is configured to transmit a clock to an integrated circuit inside the memory device. The first switching unit switches to electrically connect the first electrode pad and the clock signal line in response to a control signal occurring for the first data input/output mode. The second switching unit switches to electrically connect the second electrode pad and the clock signal line in response to an inverse signal of the control signal occurring for the second data input/output mode.

9 Claims, 5 Drawing Sheets

MEMORY DEVICES IMPLEMENTING CLOCK MIRRORING SCHEME AND RELATED MEMORY SYSTEMS AND CLOCK MIRRORING METHODS

CROSS-REFERENCE TO RELATED PATENT APPLICATIONS

This application claims priority to and the benefit of U.S. patent application Ser. No. 12/902,328, filed Oct. 12, 2010, which itself claims priority to and the benefit of U.S. patent application Ser. No. 12/045,289, filed on Mar. 10, 2008, now U.S. Pat. No. 7,814,239, which itself claims priority to and benefit of Korean Patent Application No. 10-2007-0024680, filed on Mar. 13, 2007, in the Korean Intellectual Property Office, the disclosures of all of which are incorporated herein in their entirety by reference.

BACKGROUND OF THE INVENTION

1. Field of the Invention

The present invention relates to semiconductor memory devices, and more particularly, to clocking of memory devices.

2. Description of the Related Art

A large memory capacity can be obtained for a memory system using a plurality of memory chips that are connected in a parallel architecture. For example, a memory system having an X32 data input/output bandwidth can use one DRAM that inputs/outputs 32-bit data in parallel through 32 data pins. To increase the memory capacity, the memory system can use two DRAMs on opposite sides of a memory board, and each DRAM can be accessed in an X16 mode.

FIG. 1 illustrates a conventional memory system. Referring to FIG. 1, a first memory chip 120 and a second memory chip 130 are respectively placed on the top and bottom of the board 110 in the memory system 100. The combination of the first memory chip 120 and the second memory chip 130 together support an X32 mode, and are installed horizontally along the X-axis of the board 110 in a mirroring scheme. In order to support the X32 mode in the memory system 100, 16-bit data input/output lines DQ are connected to the first memory chip 120 and 16-bit data input/output lines DQ are connected to the second memory chip 130. The structure of the data input/output lines is to provide each data input/output line DQ with the load of the memory chip 120 or 130 since signal integrity decreases if the load of the two memory chips 120 and 130 is applied on each data input/output line if 32-bit data input/output lines DQ are connected to the first memory chip 120 and the second memory chip 130.

As shown in FIGS. 2A-B, 32 data input/output pins DQ0 through DQ31 in the first memory chip 120 are connected to corresponding data transmitting clocks WCK01 and WCK23 which control timing of data input/output operations. Each of the data transmitting clocks WCK01 and WCK23 is provided as a differential signal pair. While a first data transmitting clock pair (WCK01, /WCK01) is connected to data input/output pins DQ0 through DQ7 and DQ16 through DQ23, a second data transmitting clock pair (WCK23, /WCK23) is connected to data input/output pins DQ8 through DQ15 and DQ24 through DQ31.

As shown in FIG. 3, the data transmitting clock pairs (WCK01, /WCK01) and (WCK23, /WCK23) are interconnected through ball grid array (BGA) package balls in the first and second memory chips 120 and 130. In the first memory chip 120, the first data transmitting clock pair (WCK01, /WCK01) is respectively connected to a pin located in the $3^{rd}$ column of B row (B3) and to a pin located in the $4^{th}$ column of B row (B4), the second data transmitting clock pair (WCK23, /WCK23) is respectively connected to a pin located in the $9^{th}$ column of B row (B9) and to a pin located in the $10^{th}$ column of B row (B10), and a command and address transmit clock pair (CK, /CK) is respectively connected to a pin located in the $7^{th}$ column of N row (N7) and to a pin located in the $7^{th}$ column of P row (P7). The package of a second memory chip 130 is facing the package of a first memory chip 120 along the horizontal axis of the memory system in a mirroring scheme, and the first data transmitting clock pair (WCK01, /WCK01) in the second memory chip 130 is connected to pins located in B3 and B4, the second data transmitting clock pair (WCK23, /WCK23) is connected to pins located in B9 and B10, and the command and address transmit clock pair (CK, /CK) is connected to pins located in N7 and P7.

The first and the second data transmitting clock pairs (WCK01, /WCK01) and (WCK23, /WCK23), and the command and address transmitting clock pair (CK, /CK) are delivered through signal lines on top of the board 110 and connected to respective pins located in B3, B4, B9, B10, N7, and P7 in the first memory chip 120. The clocks WCK01, /WCK01, WCK23, /WCK23, CK, and /CK are delivered to the second memory chip 130 through electrodes 111, 112, 113, 114, 115, and 116 placed underneath the pins located in B3, B4, B9, B10, N7, and P7 in the first memory chip 120 and connected to the pins located in B3, B4, B9, B10, N7, and P7 in the second memory chip 130. Accordingly, the signal lines delivering the clocks WCK01, /WCK01, WCK23, /WCK23, CK, and /CK in the second memory chip 130 form a stub structure that receives the load of the two memory chips 120 and 130, which results in a decrease of the signal integrity.

SUMMARY OF THE INVENTION

In some embodiments, a memory device is configured to operate in first and second data input/output modes. The memory device includes a first electrode pad, a second electrode pad, a clock signal line, a first switching unit, and a second switching unit. The clock signal line is configured to transmit a clock to an integrated circuit inside the memory device. The first switching unit switches to electrically connect the first electrode pad and the clock signal line in response to a control signal occurring for the first data input/output mode. The second switching unit switches to electrically connect the second electrode pad and the clock signal line in response to an inverse signal of the control signal occurring for the second data input/output mode.

In some further embodiments, during the first data input/output mode, the memory device can operate in an X16 mode inputting/outputting 16 parallel bits to/from the integrated circuit responsive to the clock on the clock signal line received at the connected first electrode pad while the second electrode pad is electrically isolated from the clock signal line. During the second data input/output mode, the memory device can operate in an X32 mode inputting/outputting 32 parallel bits to/from the integrated circuit responsive to the clock on the clock signal line received at the connected second electrode pad while the first electrode pad is electrically isolated from the clock signal line.

In some further embodiments, the first electrode pad is connected to a Reserved for Future Use (RFU) pin among package pins of the memory device.

In some further embodiments, the RFU pin connected to the first electrode pad is connected to a clock pin among package pins of another memory device.

In some further embodiments, the second electrode pad is a package pin that receives the clock and is among package pins of the memory device.

According to some other embodiments, a memory system operates according to first and second input/output modes. The memory system includes a board, a first memory chip, and a second memory chip. The first memory chip is attached to a first surface of the board and includes a first package having a first pin connected to a clock signal line that carries a clock transmitted to the board. The second memory chip is attached to a second surface of the board, opposite to the first surface, and includes a second package having a second pin, which is opposite and adjacent to the first pin and is connected to the first pin by a through-electrode extending through the board, and a third pin located at a mirror site of the first pin. In response to the first data input/output mode, the second pin in the second package of the second memory chip is switched to be electrically connected to the clock signal line. In response to the second data input/output mode, the third pin in the second package of the second memory chip is switched to be electrically connected to the clock signal line.

In some further embodiments, the clock signal line transmits the clock to an integrated circuit within the second package. The second memory chip includes a first electrode pad, a second electrode pad, a first switching unit, and a second switching unit. The first electrode pad is connected to the second pin. The second electrode pad is connected to the third pin. The first switching unit switches to electrically connect the first electrode pad and the clock signal line in response to a control signal occurring for the first data input/output mode. The second switching unit switches to electrically connect the second electrode pad and the clock signal line in response to an inverse signal of the control signal occurring for the second data input/output mode.

In some further embodiments, during the first data input/output mode, the memory system operates in an X16 mode.

In some further embodiments, during the second data input/output mode, the memory device operates in an X32 mode.

In some further embodiments, the first electrode pad is connected to a Reserved for Future Use (RFU) pin among the package pins in the second memory chip.

According to some other embodiments, a clock mirroring method is provided for a memory system having first and second memory chips attached to opposite sides of a memory board. The clock mirroring method includes: receiving a clock signal into a first pin of the first memory chip; receiving the clock signal into a second pin of the second memory chip when operating in a first data input/output mode, wherein the second pin is opposite and adjacent to the first pin and is connected to the first pin by a through-electrode extending through the board; and receiving the clock signal into a third pin of the second memory chip when operating in a second data input/output mode, wherein the third pin is located at a mirror site of the first pin.

In some further embodiments, during the first data input/output mode, the memory system operates in an X16 mode.

In some further embodiments, during the second data input/output mode, the memory system operates in an X32 mode.

In some further embodiments, the second pin is a Reserved for Future Use (RFU) pin among package pins in the second memory chip.

According to some other embodiments, a memory device is configured to operate in first and second data input/output modes. The memory device includes a first electrode pad; a second electrode pad, a clock signal line transmitting a clock to a circuit inside the memory device, a first switching unit connecting the first electrode pad and the clock signal line in response to a control signal in the first data input/output mode; and a second switching unit connecting the second electrode pad and the clock signal line in response to an inverse signal of the control signal in the second data input/output mode.

According to some other embodiments, a memory system is configured to operate in first and second input/output modes. The memory system includes: a board; a first memory chip installed on a first surface of the board and having a first package with a first pin connected to a clock transmitted to the board; and a second memory chip installed on a second surface of the board and having a second package with a second pin located beneath the first pin and connected to the first pin via through-electrodes on the board. The second memory chip is connected to a clock input to a second pin in the first data input/output mode, and is also connected to a clock input to the third pin of the second package in the second data input/output mode:

According to some other embodiments, a clock mirroring method of a memory system includes mounting a first memory chip and a second memory chip on the top and bottom of an board in a mirroring scheme, transmitting a clock signal into a first pin of the first memory chip, transmitting the clock signal into a second pin of the second memory chip in the first data input/output mode, the second pin located beneath the first pin and connected to the first pin via through-electrodes on the board, and transmitting the clock signal into a third pin of the second memory chip in the second data input/output mode, the third pin located a mirror site of the first pin by the mirroring scheme.

BRIEF DESCRIPTION OF THE DRAWINGS

The above and other features and advantages of the present invention will become more apparent through the following description of exemplary embodiments thereof with reference to the attached drawings in which.

DETAILED DESCRIPTION OF EMBODIMENTS OF THE INVENTION

Figure 1:
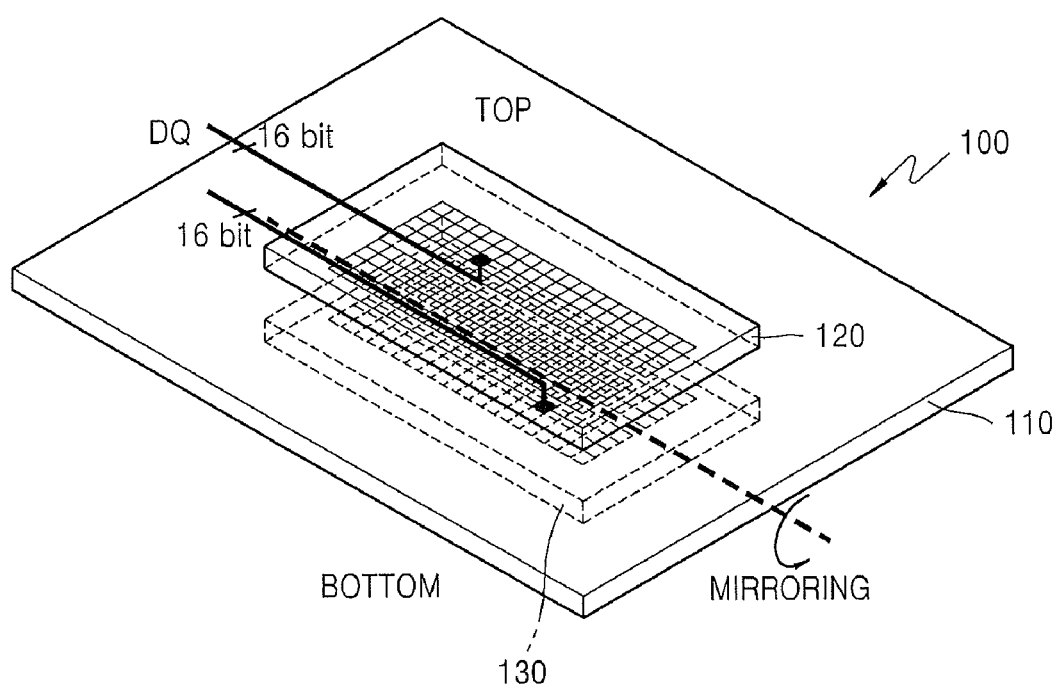
FIG. 1 illustrates a conventional memory system.
Figure 2A:
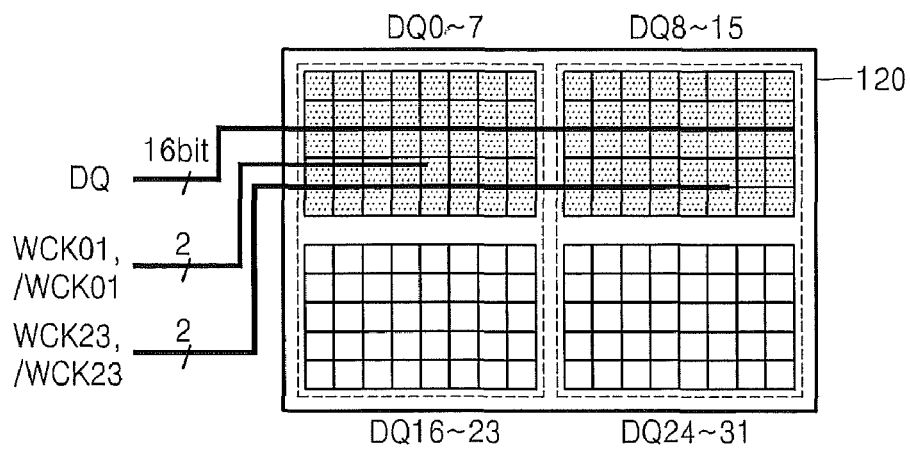
FIGS. 2A and 2B illustrate first and second conventional memory chips corresponding to the memory system shown in FIG. 1.
Figure 2B:
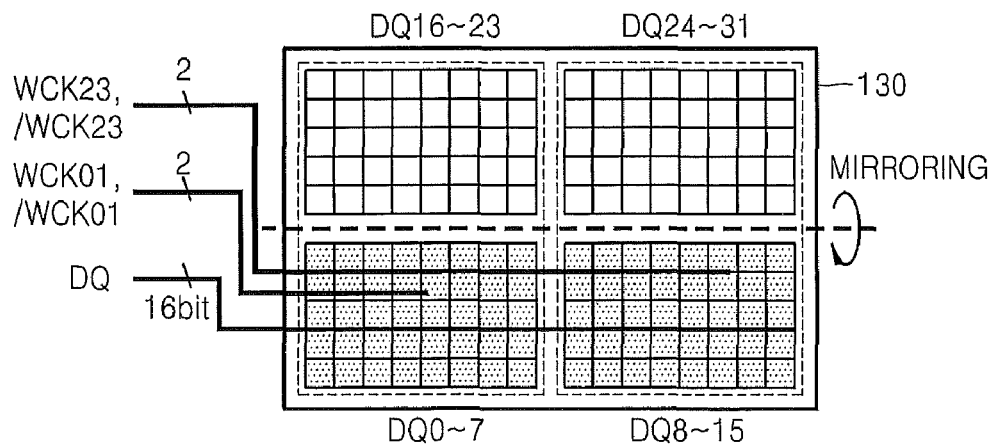
Figure 3:
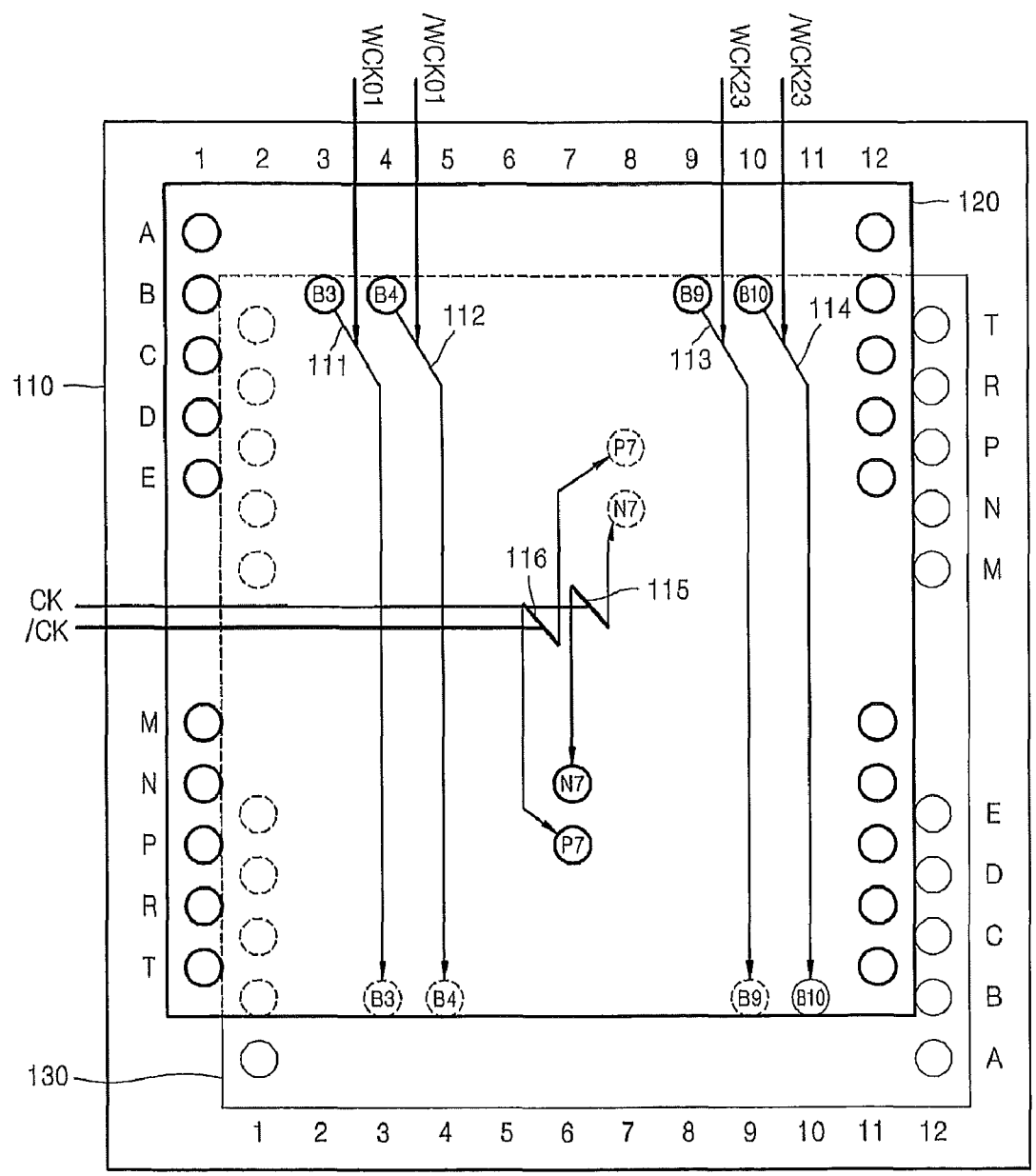
FIG. 3 illustrates a ball grid array (BGA) package connected to clock pairs of the first and the second conventional memory chips illustrated in FIG. 1.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a film, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to schematic illustrations of idealized embodiments (and intermediate structures) of the invention. The thickness of films, layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an etched/implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 4:
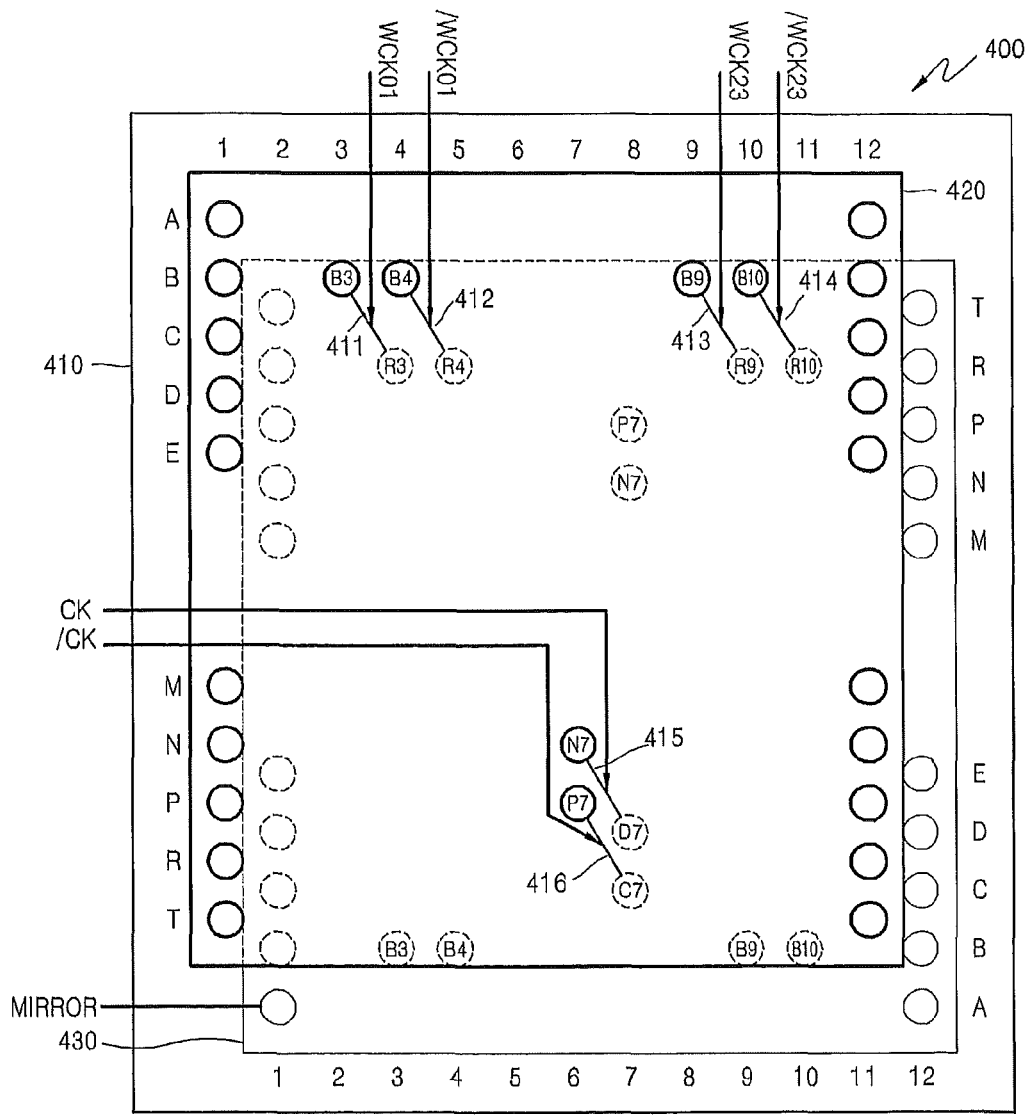
FIG. 4 illustrates a memory system according to some embodiments of the present invention.

FIG. 4 illustrates a memory system according to some embodiments of the present invention. Referring to FIG. 4, the memory system 400 includes a first memory chip 420 and a second memory chip 430 of a BGA package, respectively attached to opposite sides of the board 410. The first memory chip 420 and the second memory chip 430 are configured to support an X32 mode, in which 32 bits of data can be input/output in parallel from the memory system 400. First and second data transmitting clock pairs (WCK01, /WCK01) and (WCK23, /WCK23) and a command and address transmitting clock pair (CK, /CK) are delivered through signal lines along, for example, the top of the board 410 in the memory system 400.

In the first memory chip 420, the first data transmitting clock pair (WCK01, /WCK01) is connected to pins located at B3 and B4, the second data transmitting clock pair (WCK23, /WCK23) is connected to pins located at B9 and B10, and the command and address transmitting clock pair (CK, /CK) is connected to pins located at N7 and P7.

The pins located in B3 and B4 in the first memory chip 420 are connected to pins located in the $3^{rd}$ column of R row (R3) and the $4^{th}$ column of R row (R4) in the second memory chip 430 via through-electrodes 411 and 412 in the board 410. Accordingly, the first data transmitting clock pair (WCK01, /WCK01) is connected to the pins located in R3 and R4 in the second memory chip 430.

The pins located in B9 and B10 in the first memory chip 420 are connected to pins located in the $9^{th}$ column of R row (R9) and the $10^{th}$ column of R row (R10) in the second memory chip 430 via through-electrodes 413 and 414 in the board 410. Accordingly, the second data transmitting clock pair (WCK23, /WCK23) is connected to the pins located in R9 and R10 in the second memory chip 430.

The pins located in N7 and P7 in the first memory chip 420 are electrically connected to pins located in the $7^{th}$ column of D row (D7) and the $7^{th}$ column of C row (C7) in the second memory chip 430 via through-electrodes 415 and 416 extending through the board 410. Accordingly, the command and address transmitting clock pair (CK, /CK) is electrically connected to the pins located in D7 and C7 in the second memory chip 430.

When operating in an X16 mode of the memory system 400 (e.g., inputting/outputting 16 parallel bits), the second memory chip 430 uses the first data transmitting clock pair (WCK01, /WCK01) received by the pins located at R3 and R4, the second data transmitting clock pair (WCK23, /WCK23) received by the pins located at R9 and R10, and the command and address transmitting clock pair (CK, /CK) received by the pins located at D7 and C7. Pins R3, R4, R9, R10, D7, and C7 in the second memory chip 430 can be Reserved for Future Use (RFU) pins.

In contrast, when operating in an X32 mode of the memory system 400 (e.g., inputting/outputting 32 parallel bits), the second memory chip 430 uses the first data transmitting clock pair (WCK01, /WCK01) received by the pins located at B3 and B4, the second data transmitting clock pair (WCK23, /WCK23) received by the pins located at B9 and B10, and the command and address transmitting clock pair (CK, /CK) received by the pins located at N7 and P7.

Figure 5:
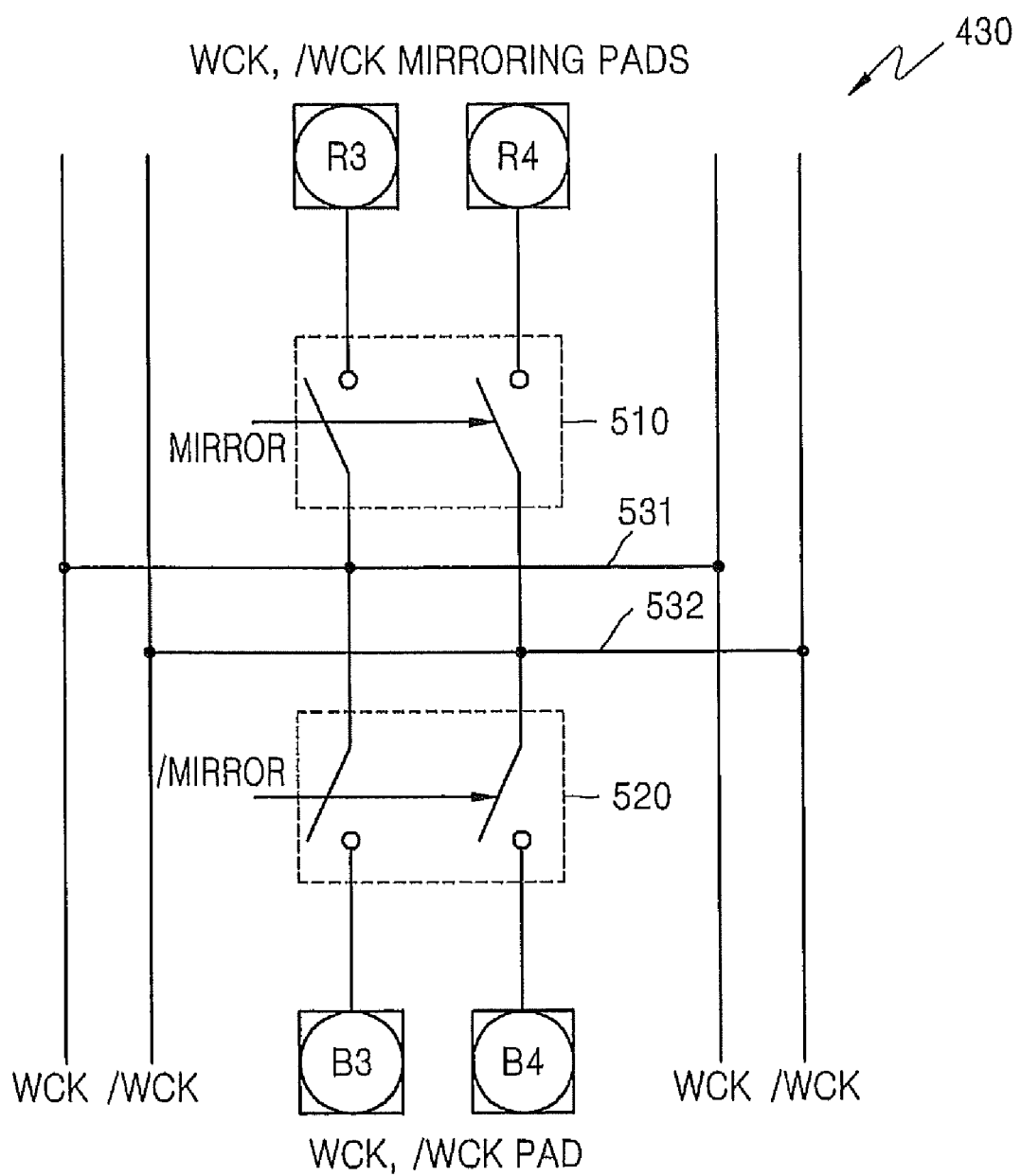
FIG. 5 illustrates a clock mirroring scheme of a second memory chip illustrated in FIG. 4 according to some embodiments of the present invention.

FIG. 5 illustrates an embodiment of a clocking scheme in the second memory chip 430 using the first data transmitting clock pair (WCK01, /WCK01). The second memory chip 430 includes a first switching unit 510 which is located between pins R3 and R4 mirrored underneath pins to which the first data transmitting clock pair (WCK01, /WCK01) of the first memory chip 420 in FIG. 4 is connected, and signal lines 531 and 532 of the first data transmitting clock pair (WCK01, /WCK01) inside the second memory chip 430. The first switching unit 510 is configured to switch to connect the pins R3 and R4 and the signal lines 531 and 532, respectively, of the first data transmit clock pair (WCK01, /WCK01) in response to occurrence of a mirroring signal MIRROR, and while a second switching unit 520 electrically isolates the pins at B3 and B4 from the signal lines 531 and 532. The mirroring signal MIRROR is a control signal supporting an X16 mode or X32 mode of the second memory chip 430. The mirroring signal MIRROR is input by the pin located in A1 of the second memory chip 430. The pin A1 of the second memory chip 430 may be fixed to a power supply voltage during the X16 mode. The pin A1 of the second memory chip 430 may be fixed to a ground voltage during the X32 mode.

The second memory chip 430 also includes the second switching unit 520 that operates in response to occurrence of an inverse mirroring signal /MIRROR to switch to electrically interconnect the pins at B3 and B4 and the signal lines 531 and 532, respectively, of the first data transmitting clock pair (WCK01, /WCK01), while the first switching unit 510 electrically isolates the pins R3 and R4 from the signal lines 531 and 532. The inverse mirroring signal /MIRROR is a signal that occurs during operation of an X32 mode of the second memory chip 430.

The inner clocking scheme of the first data transmitting clock pair (WCK01, /WCK01) in FIG. 5 is also applied to the second data transmitting clock pair (WCK23, /WCK23) and the command and address transmitting clock pair (CK, /CK). Accordingly, other switching units operate to electrically connect and isolate respective ones of the second data transmitting clock pair (WCK23, /WCK23) and the command and address transmitting clock pair (CK, /CK) and associated pins of the second memory chip for 30.

Accordingly, when the memory system 400 in FIG. 4 is operating in an X16 mode, a stub effect (e.g., signal resonance) is reduced since the signal lines carrying the clocks WCK01, /WCK01, WCK23, /WCK23, CK, and /CK are directly connected to the pins in the first and the second memory chips 420 and 430 which are adjacent to the through-electrodes of the board 410. Also, the load of the two memory chips 420 and 430 is reduced by removing a load according to the length of the signal line for the clocks WCK01, /WCK01, WCK23, and /WCK23 in the conventional second memory chip 130.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory system comprising;
    a board;
    a first memory chip attached to a first surface of the board and having a first electrode pad that is connected to a first clock signal line that carries a first clock signal transmitted to the first memory chip; and
    a second memory chip attached to a second surface of the board,
wherein the second memory chip comprising a second electrode pad that is connected to the first electrode pad by a through-electrode extending through the board, and a first switching unit that switches to electrically connect the second electrode pad to an integrated circuit in response to a first level of a control signal to transmit the first clock signal from the second electrode pad to the integrated circuit.

2. The memory system of claim 1, where in the second memory chip further comprising:
    a third electrode pad that is connected to a second clock signal line that carries a second clock signal to the second memory chip, a second switching unit that switches to electrically connect the third electrode pad to the integrated circuit in response to a second level of the control signal to transmit the second clock signal from the third electrode pad to the integrated circuit.

3. The memory system of claim 1, wherein the control signal is a mirroring signal.

4. The memory system of claim 1, wherein the first clock signal and the second clock signals are data clock signals.

5. The memory system of claim 4, wherein the data clock signals are WCK signals.

6. The memory system of claim 4, wherein the data clock signal is a WCK01 or a WCK23 signal.

7. The memory system of claim 1, the second chip operates in x16 mode when the integrated circuit receives the first clock signal through the second electrode pad.

8. The memory system of claim 2, the second chip operates in x32 mode when the integrated circuit receives the second clock signal through the third electrode pad.

9. The memory system of claim 1, wherein the second electrode pad is located at a mirroring site of the first electrode pad.

* * * * *